(12) United States Patent
Palma

(10) Patent No.: US 7,667,550 B2
(45) Date of Patent: Feb. 23, 2010

(54) DIFFERENTIAL OSCILLATOR DEVICE WITH PULSED POWER SUPPLY, AND RELATED DRIVING METHOD

(75) Inventor: Fabrizio Palma, Rome (IT)

(73) Assignee: Universita' Degli Studi Di Roma "La Sapienza", Rome (IT)

( * ) Notice: Subject to any disclaimer, the term of this patent is extended or adjusted under 35 U.S.C. 154(b) by 244 days.

(21) Appl. No.: 11/813,160

(22) PCT Filed: Dec. 22, 2005

(86) PCT No.: PCT/IT2005/000756

§ 371 (c)(1),
(2), (4) Date: Jul. 30, 2007

(87) PCT Pub. No.: WO2006/070427

PCT Pub. Date: Jul. 6, 2006

(65) Prior Publication Data

US 2008/0218280 A1 Sep. 11, 2008

(30) Foreign Application Priority Data

Dec. 30, 2004 (IT) .................... RM2004A0648

(51) Int. Cl.
*H03B 5/00* (2006.01)
(52) U.S. Cl. ............... 331/185; 331/16; 331/34; 331/177 R; 331/175
(58) Field of Classification Search .......... 331/185, 331/16, 175, 34, 177 R
See application file for complete search history.

(56) References Cited

U.S. PATENT DOCUMENTS

| | | | |
|---|---|---|---|
| 4,063,193 A | 12/1977 | Wilcox | |
| 5,539,761 A * | 7/1996 | Golub et al. | 372/38.02 |
| 5,955,929 A | 9/1999 | Moon et al. | |
| 5,986,514 A * | 11/1999 | Salvi et al. | 331/17 |
| 6,064,277 A | 5/2000 | Gilbert | |
| 6,140,880 A | 10/2000 | Moyal et al. | |
| 6,542,043 B1 | 4/2003 | Cao | |
| 6,653,908 B1 | 11/2003 | Jones | |
| 2004/0085144 A1 | 5/2004 | Wu et al. | |

FOREIGN PATENT DOCUMENTS

| | | |
|---|---|---|
| EP | 0899866 A | 3/1999 |
| EP | 1093215 A | 4/2001 |

OTHER PUBLICATIONS

Thomas H. Lee, "The Design of CMOS Radio Frequency Integrated Circuits", Chapter 16, pp. 488-500, Cambridge University Press, 1998.

(Continued)

*Primary Examiner*—Arnold Kinkead
(74) *Attorney, Agent, or Firm*—Stanislaus Aksman; Roberts Mlotkowski Safran & Cole P.C.

(57) ABSTRACT

The present invention concerns a differential oscillator device, comprising resonant electronic means, capable to provide on at least two terminals at least one oscillating signal $V_{OUT}$, which comprises a generator electronic means capable to supply at least one power supply pulsed signal to said resonant electronic means in phase relation with said at least one oscillating signal $V_{OUT}$. The present invention further concerns a process of supplying pulsed power to such a differential oscillator device.

32 Claims, 5 Drawing Sheets

OTHER PUBLICATIONS

Alpher Demir et al., "Phase Noise in Oscillators: A Unifying Theory and Numerical Methods for Characterization." Fundamental Theory and Applications, vol. 47., No. 5, May 2000, pp. 655-674.

Ali Hajimiri et al., "A General Theory of Phase Noise in Electrical Oscillators." IEEE Journal of Solid-State Circuits, vol. 33, No. 2, 1998, pp. 179-194.

Robert Aparicio, "A CMOS Differential Noise-Shifting Colpitts VCO." IEEE Journal Of Solid-State Circuits Conference Session. 17 No. 2 (2002).

D. B. Leeson, "A Simple Model of Feedback Oscillator Noise Spectrum." Applied Technology Inc., Palo Alto, Calif., (1965) pp. 329-330.

* cited by examiner

DIFFERENTIAL OSCILLATOR DEVICE WITH PULSED POWER SUPPLY, AND RELATED DRIVING METHOD

CROSS-REFERENCE TO RELATED APPLICATIONS

This application is a 35 U.S.C. §371 of International Application No. PCT/IT2005/000756 filed Dec. 22, 2005, which claims priority from Italian patent application RM2004A000648, filed Dec. 30, 2004, the entire contents of which including amendments made in the International Application, are incorporated herein by reference.

FIELD OF THE INVENTION

The present invention relates to a differential oscillator device with pulsed power supply that has a substantially neglectable phase noise and a high power supply noise rejection, being simple, reliable, efficient, precise, and capable to generate oscillating signals even at high frequencies, also entailing a reduced power consumption. The device according to the invention is further usable in very many applications wherein the generation of an oscillating signal is required.

The present invention further relates to the related process for providing the pulsed power supply to the differential oscillator.

In the following of the description, specific reference will be made to the application of oscillators to the telecommunication field, but it should be understood that the device (and the related driving process) according to the invention may be applied to any field when a generator of oscillating signals is required.

BACKGROUND OF THE INVENTION

It is known that reduction of manufacture costs and applicability to a wide market of the modern mobile telecommunication network has been rendered possible thanks to the microelectronic circuit manufacture.

The typical example is the mobile or cellular telephone, where the whole communication system is substantially made in a single chip. The microelectronic manufacture has imposed a series of design constraints and it has created manufacturing problems which, in turn, have had the benefit to spur the scientific and technological search for the solution thereof.

Presently, the modern mobile systems use a variety of transmission interfaces, including GSM (Global System for Mobile Access), TDMA (Time Division Multiple Access) and CDMA (Code Division Multiple Access). In these systems a low noise local oscillator is required. A low noise local oscillator in optical receivers is similarly necessary.

Voltage controlled oscillators or VCOs represent a decisive element for making synthesised signal generators through their use in Phase Locked Loops or PLLs. In these devices a reference generator, generally a un quartz crystal oscillator with oscillation frequency considerably lower than of the VCO, controls the precision of it through the comparison of the two relative phases and through the generation of an error signal that modifies the VCO frequency, correcting possible deviations.

U.S. Pat. No. 4,063,193 discloses a differential oscillator comprising a parallel resonant circuit, operating as oscillator time reference, that is separated form both the ground and the power supply, and it is power supplied in a differential way by two transistors, controlled by the same voltage across the resonant circuit, so as to operate as switches, supplying power in alternate way to the two ends of the resonant circuit with a current generally produced by a current generator.

Many implementations of this circuit exist, in particular with active loads, and implementations with both MOS and bipolar transistors have been presented.

The differential one is certainly the configuration more used in integrated circuits. In this regard, the differential architecture represents the basis for making VCO oscillators, since the differential connection of the oscillating circuit easily allow the addition, in parallel to the resonant circuit, of the series of two equal variable, voltage controlled, capacitors: for the existing symmetry, the central node between the two capacitors is devoid of differential signal and it may hence be connected to a control voltage, capable to modify the capacitance of a diode or MOS, thus allowing the oscillator frequency to be controlled.

U.S. Pat. No. 5,955,929 discloses a differential VCO oscillator resistant to the power supply voltage noise, comprising a VCO, based on a delay signal, including a cascade of delay cells, each one comprising a compensation circuit and a reference current source. The compensation circuit adjusts the capacitance of the delay cell for compensating the noise introduced by the power supply.

U.S. Pat. No. 6,140,880 discloses a circuit architecture comprising a VCO and a circuit that, particularly during power up and initial acquisition of the phase to be locked, prevents the oscillator from oscillating outside a predetermined frequency range. In particular, the circuit is particularly complex and comprises a frequency and phase detector, driven by a oscillating reference signal, that generates through a proper filter a control voltage of the VCO, from which it draws a feedback signal, through a frequency divider.

U.S. Pat. No. 6,542,043 discloses a voltage controlled differential oscillator comprising a resonant LC circuit, including a pair of variable capacitance components and an inductor, provided with a central node connected to the circuit ground through a resistor. In particular, the oscillator amplification and bias are adjusted through a corresponding adjustment of the resistance connecting the inductor central node to ground.

U.S. Pat. No. 6,653,908 discloses a differential oscillator generating an oscillating signal the amplitude of which is automatically controlled for selectively minimising the phase noise. In particular, the differential oscillator, including two symmetrical LC resonant branches, comprises a current source that is controlled by a voltage signal resulting from the processing of a negative peak detector and of a positive peak detector, in order to adjust the amplitude of the oscillating signal generated by the oscillator.

US Patent Application No. US2004085144 discloses a VCO oscillator made as differential oscillator comprising a plurality of transistors operating as switches, and a parallel LC resonant circuit, a current source for supplying the oscillating circuit, and a biasing circuit coupled to both the LC resonant circuit and the current source. In particular, the LC resonant circuit comprises a pair of variable capacitance diodes or varactor parallel connected to an inductor, provided with a central node power supplied by a bias dc voltage.

In spite of the control and correction mechanism with which a Vco is provided, the synthesised source is not ideal: random frequency variations around the nominal value are present. These variations constitute an enlargement of the source spectrum. The portion of spectrum ranging from tens of KHz up to some MHz from the carrier is generally the one of greatest interest for telecommunication. The presence of phase noise in this band entails a mixing among close channels in many wireless applications (such as for instance GSM and WLAN).

In this interval the correction of the PLL circuit is limited, sometimes greatly, by the band of the feedback loop, that in turn is limited for stability problems. The VCO noise is hence determining in the final characteristics of the system.

Unwanted variations of frequency (and phase) of the VCO may have various origins. A first source of alteration of the oscillator evolution is due to the noise present in the electronic circuits, in particular in the parasitic resistances of the reactive components of the resonant circuit representing the oscillator time reference, partly in the circuits which must periodically supply the resonant circuit with the energy lost during the oscillation just because the parasitic resistances.

To this phenomenon, usually defined as phase noise, the possibility of deviations, due to the interaction with the rest of the circuits within the integrated circuit wherein the oscillator is contained, adds. The phenomenon of frequency variation, called VCO pull-in, is of particular relevance, which is related to the effects on the oscillator by sudden variations of the power supply voltage due to, e.g., sudden power up or power down of adjacent circuit portions with high current loads, in particular of output circuits of the transmitter part, normally integrated within the same circuit for the reasons of savings.

Consequently, the possibility to design VCO with low phase noise is of particular interest in developing integrated circuits for telecommunication.

Document EP 0 899 866 A discloses an oscillator circuit including differential amplifier, having resonant means supplied by a current source, to which MOSFET varactors are coupled, wherein the capacitance of the MOSFET varactors, and therefore the oscillating frequency of the oscillator, is controlled by a tuning voltage applied to a common node of the MOSFET varactors.

Document EP 1 093 215 discloses an oscillator circuit having resonant means and an active stage electrically connected to and injecting power to the same at instants when the maximum value of the output oscillating signal occurs.

However, no one of the oscillators available nowadays, among the previously mentioned ones, has a low phase noise, though some of them have rather complex circuit architectures.

SUMMARY OF THE INVENTION

It is therefore an object of the present invention to provide an oscillating signal generator device having a substantially neglectable phase noise and a high power supply noise rejection.

It is still an object of the present invention to use even complex circuits, which may be easily added to an integrated circuit without appreciable burden of dissipated power, for improving the phase noise characteristics of the integrated oscillator.

It is a further object of the present invention to provide such a device that is capable to generate oscillating signals even at high frequencies.

It is specific subject matter of the present invention a differential oscillator device, comprising resonant electronic means, capable to provide on at least two terminals at least one oscillating signal $V_{OUT}$, characterised in that it comprises generator electronic means capable to supply at least one power supply pulsed signal to said resonant electronic means in phase relation with said at least one oscillating signal $V_{OUT}$.

Preferably according to the invention, said generator electronic means is capable to supply said at least one power supply pulsed signal to said resonant electronic means in instants at which the projection of a vector representative of said at least one power supply pulsed signal on the first Floquet eigenvector of the state variables of the circuit as a whole is lower than a maximum threshold value.

Always according to the invention, said generator electronic means may be capable to supply said at least one power supply pulsed signal to said resonant electronic means in instants at which the projection of a vector representative of said at least one power supply pulsed signal on the first Floquet eigenvector of the state variables of the differential oscillator circuit as a whole is lower than a maximum threshold value, preferably equal to zero.

Still according to the invention, said generator electronic means may be capable to supply said at least one power supply pulsed signal to said resonant electronic means in instants at which the effects of the orbital deviations due to the projections of a vector representative of said at least one power supply pulsed signal on the Floquet eigenvectors of the state variables of the circuit as a whole are minimised to the aim of the phase noise.

Furthermore according to the invention, said generator electronic means may be capable to supply said at least one power supply pulsed signal to said resonant electronic means in instants at which the effects on the phase noise of the orbital deviations due to the projections of a vector representative of said at least one power supply pulsed signal on the Floquet eigenvectors of the state variables of the circuit as a whole are lower than a maximum threshold value.

Always according to the invention, said generator electronic means may be capable to carry out a gain control for adjusting the energy supplied to said resonant electronic means.

Still according to the invention, said at least one power supply pulsed signal may have a duration depending on the amplitude of said at least one oscillating signal $V_{OUT}$.

Preferably according to the invention, said at least one power supply pulsed signal comprises one or more current pulses and/or one or more voltage pulses.

Always preferably according to the invention, said resonant electronic means may comprise a capacitor, and two inductors, each one connected to a respective end of the capacitor, said at least one oscillating signal $V_{OUT}$ being supplied across the capacitor.

Still according to the invention, said generator electronic means may comprise switching means capable to be controlled by driving means, that receives said at least one oscillating signal $V_{OUT}$ and supplies at least one control pulsed signal that controls said switching means so as to supply said at least one power supply pulsed signal to said resonant electronic means.

Always according to the invention, said switching means may be made by means of MOS transistors and/or bipolar transistors.

Furthermore according to the invention, said switching means may comprise two n-type MOS transistors, in differential configuration, each one of the source terminals of which is connected to a respective end of the capacitor, and to the source terminals of which the drain terminal of a third n-type MOS transistor operating as current generator is connected, said driving means driving the gate terminal of the third transistor by means of a voltage pulsed signal.

Always according to the invention, said voltage pulsed signal may comprise one or more pulses in correspondence of instants at which the projection of a vector representative of the state variable "voltage of the capacitor" on the first Floquet eigenvector of the state variables of the circuit as a whole is lower than said maximum threshold value.

Still according to the invention, said driving means may comprise phase shifter means, that receives as input said at least one oscillating signal $V_{OUT}$, the output of which is connected to signal handling electronic means capable to generate said voltage pulsed signal having a pulsation frequency twice in respect to that of said at least one oscillating signal $V_{OUT}$.

Furthermore according to the invention, said switching means may comprise two p-type MOS transistors, the source terminals of which are connected to a first power supply voltage V_bias_1, and the drain terminals of which are each connected to a respective inductor and, through respective connection electronic means, to a second power supply voltage V_bias_2, said driving means driving, in an alternate way, the gate terminals of such two MOS transistors by means of two respective further voltage pulsed signals.

Always according to the invention, said connection electronic means may comprise a fourth and a fifth n-type transistor MOS, each one of which has the drain and gate terminals in common with the corresponding terminals of a respective p-type transistor MOS, and the source terminal connected to said second power supply voltage V_bias_2.

Still according to the invention, said voltage pulsed signals may be supplied to the series resonant circuit through driving means and electronic means of connection of two common source mounted MOS transistors, comprising at least one resistor for each one of the two.

Furthermore according to the invention, said switching means may comprise two n-type MOS transistors, the drain terminals of which are connected to a first power supply voltage V_bias_1, and the source terminals of which are each connected to a respective inductor and, through respective connection electronic means, preferably resistive means, to a second power supply voltage V_bias_2, preferably equal to the circuit ground, said driving means driving, in anti-symmetrical way, the gate terminals of such two MOS transistors by means of two respective further voltage pulsed signals.

Always according to the invention, each one of said two further voltage pulsed signals may comprise one or more pulses in correspondence of instants at which the projection of a vector representative of the state variable "current in the inductor" on the first Floquet eigenvector of the state variables of the circuit as a whole is lower than said maximum threshold value.

Still according to the invention, said driving means may comprise:

second signal handling electronic means, that receives as input said at least one oscillating signal $V_{OUT}$, capable to generate an auxiliary voltage pulsed signal having a pulsation frequency twice in respect to that of said at least one oscillating signal $V_{OUT}$, phase shifter means, that receives as input said at least one oscillating signal $V_{OUT}$, capable to generate a phase shifted signal, and third signal handling electronic means, that receives as input said phase shifted signal, capable to generate said two further voltage pulsed signals phase shifted in respect to each other, having the same pulsation frequency of said at least one oscillating signal $V_{OUT}$.

Furthermore according to the invention, said driving means may comprises:

differential separator means, that receives as input said at least one oscillating signal $V_{OUT}$, capable to generate a first and a second further auxiliary signals respectively in phase and in push-pull with said at least one oscillating signal $V_{OUT}$, phase shifter means, that receives as input said first and second further auxiliary signals and that shifts their phases, and fourth signal handling electronic means, that receives as input said further phase shifted auxiliary signals, capable to generate said two further voltage pulsed signals having the same pulsation frequency of said at least one oscillating signal $V_{OUT}$.

Always according to the invention, said driving means may comprise signal handling electronic means, that receives as input a voltage pulsed signal having a pulsation frequency twice in respect to that of said at least one oscillating signal $V_{OUT}$, capable to generate said two further voltage pulsed signals having the same pulsation frequency of said at least one oscillating signal $V_{OUT}$.

Still according to the invention, said signal handling electronic means may comprise multiplying means that multiplies said voltage pulsed signal received as input by a square wave at the same pulsation frequency of said at least one oscillating signal $V_{OUT}$, with preferably symmetrical levels, still more preferably equal to +1 and −1, necessary to alternate the polarities of the pulses of said voltage pulsed signal received as input.

Furthermore according to the invention, said switching means may simultaneously supply to said resonant electronic means current power supply pulses and voltage power supply pulses, said power supply pulses being applied in correspondence of instants at which the projection of a state vector formed by the variables "voltage of the capacitor" and "current in the inductor" on the first Floquet eigenvector of the state variables of the circuit as a whole is lower than said maximum threshold value.

It is still specific subject matter of the present invention a process of supplying pulsed power to a differential oscillator device as previously described, characterised in that it supplies at least one power supply pulsed signal to said resonant electronic means in phase relation with said at least one oscillating signal $V_{OUT}$.

BRIEF DESCRIPTION OF THE DRAWINGS

The present invention will now be described, by way of illustration and not by way of limitation, according to its preferred embodiments, by particularly referring to the Figures of the enclosed drawings, in which.

In the Figures, alike elements are indicated by same reference numbers.

DETAILED DESCRIPTION

Figure 1:
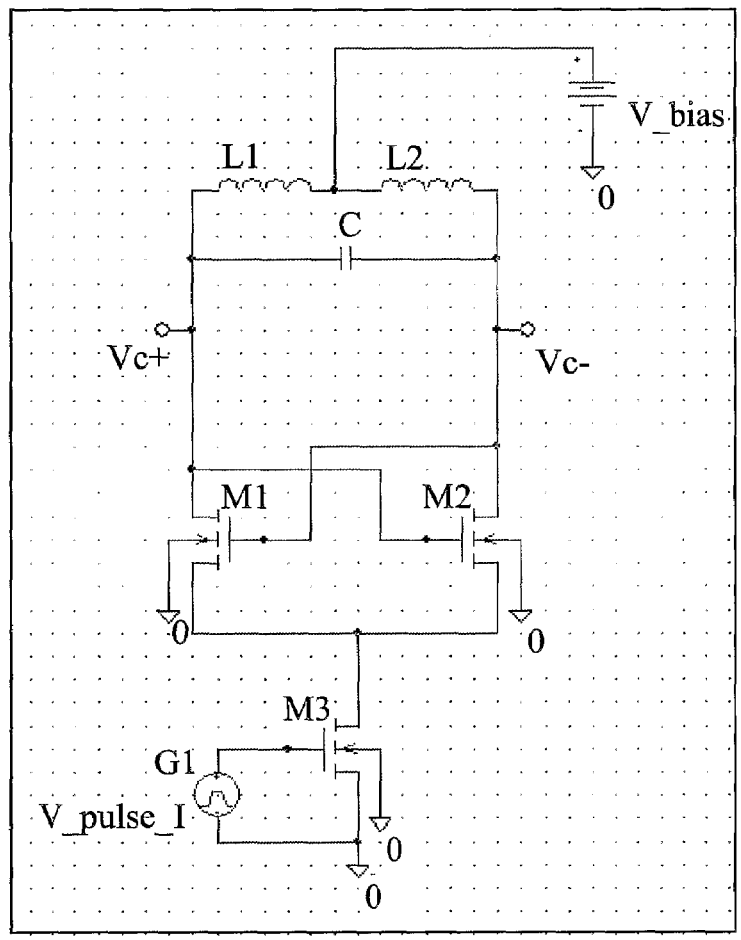
FIG. 1 schematically shows the oscillator of a first embodiment of the device according to the invention.

The inventor has started from the fact that each process of supplying the energy lost by the oscillating circuit is accompanied by random processes which render partly unpredictable the amount of re-introduced energy. As stated for instance by D. B. Leeson in "*A Simple Model of Feedback Oscillator Noise Spectrum*", Proc. IEEE, v.54, February 1966, pp. 329-30, the theory on phase noise is unanimous in indicating that this uncertainty reflects an uncertainty on the oscillator phase, it induces random frequency variations, and it hence generates an enlargement of its spectral distribution.

As described by A. Hajimiri and T. H. Lee in "*A general theory of phase noise in electrical oscillators*", IEEE Journal of Solid-State Circuits, vol. 33, p. 179-194, 1998, and by A. Demir, A. Mehrotra and J. Roychowdhury in "*Phase noise in oscillators: a unifying theory and numerical methods for characterization*", IEEE Transactions on Circuits and Systems-I, Fundamental Theory and Applications, Vol. 47, p. 655, 2000, the effect of noise related to the processes of "recharging" the state variables of the oscillator have not always the same effect on the phase noise, instead they present a stationary cyclic behaviour: depending on the specific portion of the period at which they are applied, their effect is either greater or smaller, and sometimes it is completely null. This concept has been already expressed in literature, in particular for explaining, from the point of view of the phase noise, the characteristics of one of the most famous configurations of oscillator, the Colpitts one, as described by T. H. Lee in "The Design of CMOS Radio-Frequency Integrated Circuits", Cambridge University Press, 1998, p. 488. Afterwards, the Colpitts oscillator architecture has been extended to a configuration of differential type, as described by R. Aparicio and Ali Hajimiri in "A COS Differential Noise-Shifting Colpitts VCO", Proceedings of the 2002 IEEE International Solid-State Circuits Conference, session 17, 17.2. Both the original configuration of the Colpitts oscillator and the differential type version thereof present a dc power supply, that introduces noise towards the resonant circuit for the whole oscillation period. The pulse produced by the transistors, that is necessary for maintaining the oscillation, introduces further noise that adds to that caused by the biasing generator. The time-varying behaviour of the oscillator may be defined through particular eigenvectors, called Floquet eigenvectors, defined within the space of state variables, and in particular the projections of the noise onto the first of these eigenvectors (i.e., the eigenvector with eigenvalue equal to 1, also indicated as "the first eigenvector") effectively reflect on the phase noise.

Starting from this, the inventor has developed a circuit architecture for differential oscillators that provides energy to the resonant circuit only in some properly selected instants of the period, significantly reducing both the phase noise, due to the energy supply to the resonant circuit, and the noise effects on the power supply. Such circuit architectures allows the resonant circuit to be connected to the power supply circuit that has to supply the energy lost during the oscillation thereto, only in periodical time intervals, which intervals represent a reduced portion of the oscillator period. In other words, the circuit architecture of the differential oscillator according to the invention provides to the resonant circuit the energy necessary to the oscillation in particular moments of the period, at which the influence on the phase noise is minimum.

In particular, in the following three different configurations of the differential oscillator device according to the invention are illustrated, with reference to corresponding preferred embodiments, which differ in the way according to which energy is provided to the resonant circuit, and hence in the choice of the instant at which such energy supply is carried out. The device according to the invention comprises a driving circuit (for each configuration) that generates the control of power supply pulses, capable to read the signal from the oscillator state variables and to provide (voltage and/or current) pulses properly selected within the period of oscillation. The pulse driving circuit of the device according to the invention further has the possibility to manage a gain control for properly limiting the supplied energy, once the oscillation amplitude has reached the steady state value. In this way, it is possible to avoid to add useless energy, that would entail a further detrimental increase of the noise and that would introduce unwanted spurious signals.

With reference to FIG. 1, it may be observed a first configuration of the differential oscillator, substantially based on the use of the classical differential oscillator, that is part of a first embodiment of the device according to the invention. In particular, the oscillator of FIG. 1 is made with MOS transistors, wherein a resonant circuit comprises two inductors L1 and L2 (preferably of equal inductance), series-connected and between which the power supply voltage V_bias is connected, which are connected in parallel to a capacitor C, across which the oscillating signal $V_{OUT}=V_{C+}-V_{C-}$ generated by the device of FIG. 1 is drawn.

The resonant circuit is connected, according to a conventional differential configuration, to two n-type MOS transistors M1 and M2, operating as switches, to the source terminals of which the drain terminal of a n-type transistor MOS M3 is connected, that operates as current generator, the source terminal of which is connected (as well as the substrates of the three transistors M1, M2, and M3) to the circuit ground.

The current generator supplies energy to the parallel resonant LC circuit of the oscillator through current pulses. To this end, transistor M3 is driven by a corresponding control circuit, represented in FIG. 1 by the voltage generator G1, connected to the gate terminal of transistor M3 to which it applies a pulsed voltage V_pulse_I. In particular, generator G1 generates the voltage pulses so that the corresponding current pulses applied by transistor M3 to the oscillator are properly positioned within the period, i.e., the current pulses are applied in the instants at which their effect on the oscillator phase is minimum.

In case of ideal resonant circuit, the application instants correspond to the maximum and the minimum of the voltage across the capacitor of the parallel resonant circuit in ideality conditions. In case of resonant parallel LC circuit in presence of significant distortions, the application instant must be properly delayed, choosing the instant at which the projection of the state variable "voltage of capacitor C" on the first Floquet eigenvector of the state variables of the circuit as a whole is minimum, preferably null, according to the deviation from squareness of the two main eigenvectors.

When transistor M3 (i.e., the current generator) is off, the two ends of the oscillating LC circuit remain insulated. In these conditions the presence of a possible noise on the power supply V_bias has no effect on the state of the oscillating circuit. The presence of noise on the power supply V_bias during the recharge time interval may alter the current intensity, but the proper choice of the application instant (with null projection on the first eigenvector), causes it not to reflect on the oscillator phase, but instead only on a variation of the oscillation amplitude, that is rapidly absorbed by the non-linearities of the same oscillator. Hence, a pulsed power supply makes the oscillator insensitive to the power supply noise.

Figure 2:
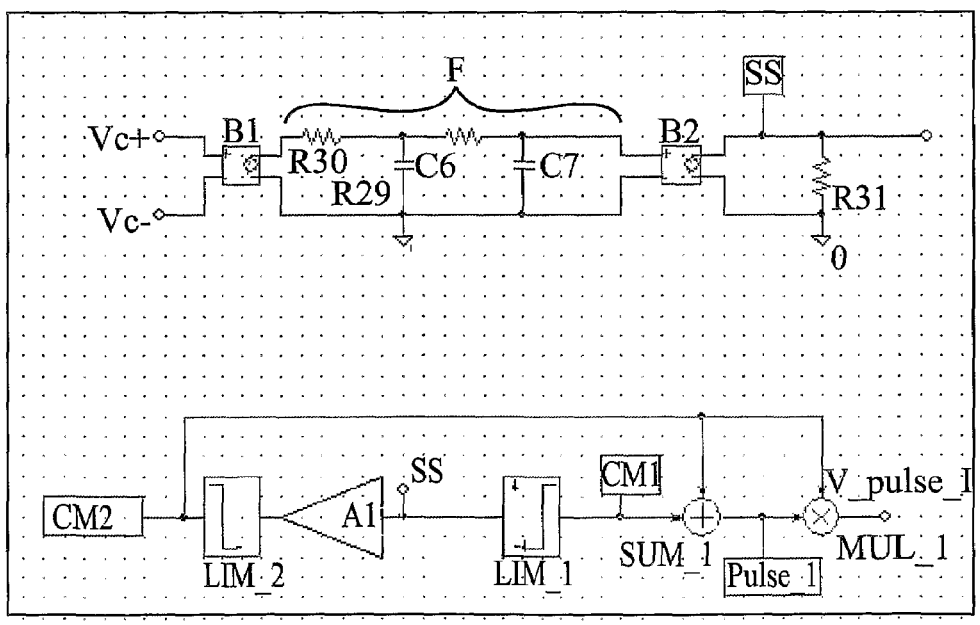
FIG. 2 schematically shows the control circuit that drives the oscillator of FIG. 1.
Figure 3:
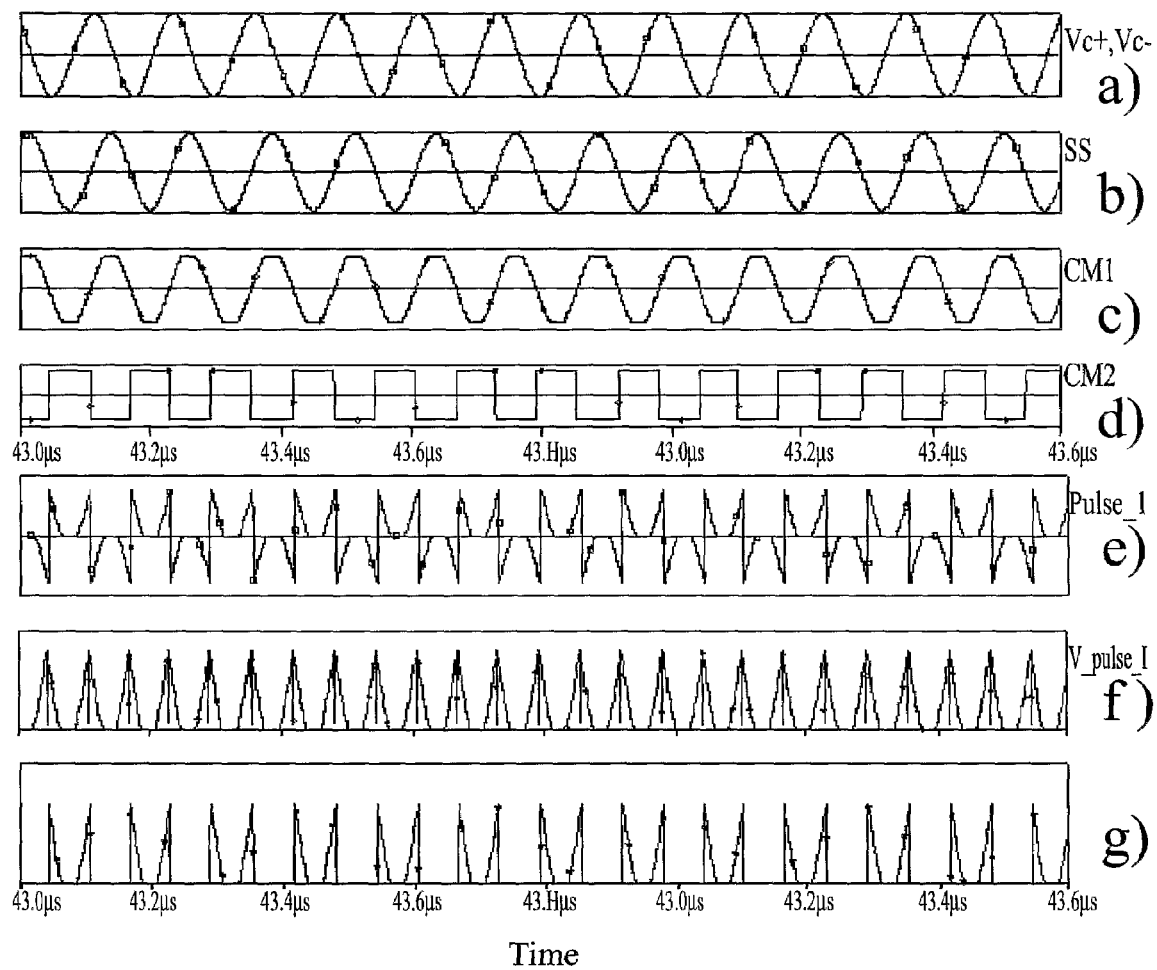
FIG. 3 shows some time graphs of the signals present in the circuit of FIG. 2.

With reference to FIG. 2 it may be observed the control circuit of the device of FIG. 1, that generates the control pulses V_pulse_I directly starting from the oscillating signal $V_{OUT}=V_{C+}-V_{C-}$ generated by the oscillator across the capacitor C, so that the control pulses V_pulse_I are in coherent relation with the phase of the same signal $V_{OUT}$. In particular, the signal $V_{OUT}$ is applied in a differential way ($V_{C+}$, $V_{C-}$) to a first separator or buffer B1 (in a first circuit portion shown in FIG. 2*a*), which transforms it in a signal with oscillating amplitude in respect to the circuit ground (i.e., to a "single ended" signal), a time graph of which is represented by way of example in FIG. 3*a*.

The signal coming from the buffer B1 is applied to a filter F that shifts its phase and applies it to a second separator B2; in case of ideal oscillator, without appreciable distortions, the phase shift must be of 90°. FIG. 3b shows the signal SS obtained as output from the second separator B2 starting from the signal $V_{OUT}$ of FIG. 3a.

The phase shifted signal SS is then applied to a second portion of the control circuit, shown in FIG. 2b, for generating a twice pulsation frequency signal. In particular, the phase shifted signal SS is clipped through a limiter LIM_1 with two levels, preferably equal in module, $+V_L$ and $-V_L$. In particular, the module $V_L$ of the compressing levels of the limiter LIM_1 is defined depending on the expected amplitude of the signal $V_{OUT}$: if the amplitude of this is lower or comparable with the compressing level $V_L$, the clipped signal CM1 appearing at the limiter output shows a significant transition interval, that for increasing amplitudes of the signal $V_{OUT}$ is proportionally reduced. FIG. 3c shows the clipped signal CM1 obtained from the limiter LIM_1 starting from the signal SS of FIG. 3b.

The phase shifted signal SS is also applied to an amplifier-inverter A1 that significantly amplifies it by an amplification value Av and that inverts it, and then the thus amplified signal is applied to a limiter LIM_2, that clips it again, preferably with the same saturation levels of the limiter LIM_1, i.e. $+V_L$ and $-V_L$. Due to the high level of the input signal of the limiter LIM_2, the output clipped signal CM2, represented in FIG. 3d, does not present an appreciable transition time.

The clipped signals CM1 and CM2 are then added at a first adder SUM_1, obtaining the signal PULSE_1 shown in FIG. 3e. From the Figure it is possible to appreciate that, due to the equal value of the saturation voltage of the clipped signals CM1 and CM2, and of the phase shift imposed on CM2, the signal PULSE_1 comprises positive and negative pulses in correspondence to the interval of zero crossing of the voltage $V_{OUT}$, while in the remaining part of the period it has a null value.

Starting from the signal PULSE_1 it is possible to obtain in several manners the positive pulsed signal V_pulse_I that is applied to the gate terminal of transistor M3. Preferably, the positive pulsed signal V_pulse_I is obtained by multiplying, through a multiplier MUL_1, the signal PULSE_1 by the signal CM2, that, by reversing the negative part of the signal PULSE_1, produces the positive pulses of the signal V_pulse_I, as shown in FIG. 3f, wherein the pulse base is equal to the whole transition time.

Alternatively, the positive pulsed signal V_pulse_I could be obtained by means of a rectifying operation on the signal PULSE_1, that cuts off the negative portion of the pulses thereof, as shown in FIG. 3g. In such case, the obtained signal shows asymmetries.

In particular, FIGS. 3f and 3g show that the positive pulsed signal V_pulse_I is correctly repeated by two times within the oscillation period of the oscillator signal $V_{OUT}$ (respectively in correspondence to the maximum and the minimum of the voltage on the capacitor C), supplying in an alternate way the two ends of the oscillating circuit.

Figure 4:
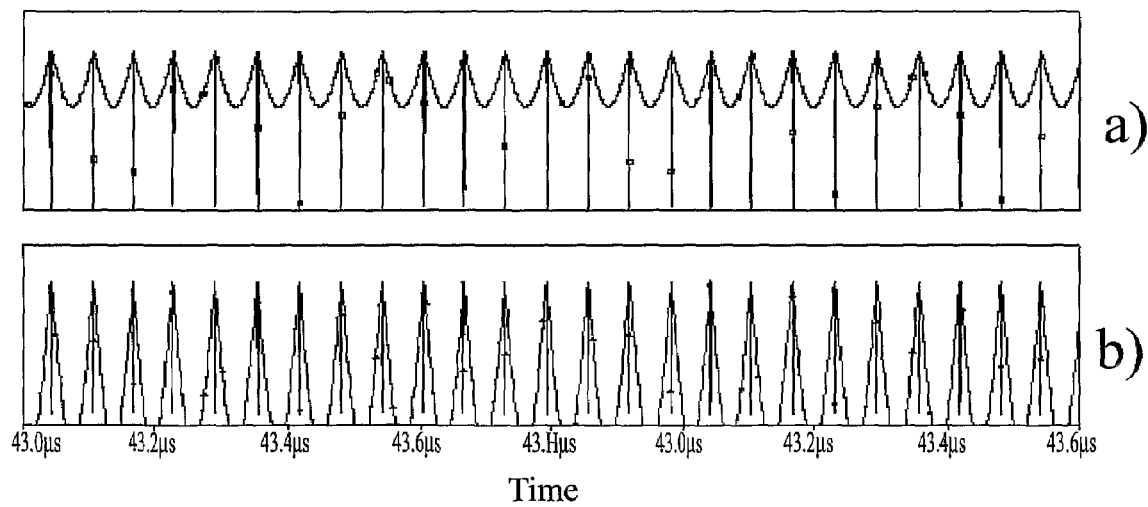
FIG. 4 shows some time graphs of the signals generated by the circuit of FIG. 2.

It should be noted that while the amplitude of the pulses of the signal V_pulse_I is constant, equal to the saturation level $V_L$ of the limiters LIM_1 and LIM_2, their length depends on the transition time of the signal CM1 and hence on the amplitude of the oscillator voltage $V_{OUT}$: as such amplitude increases, the pulse length reduces, reducing the amount of energy (i.e. the charge in the capacitor C) added to the resonant circuit during the power up of transistor M3 of the current generator. By way of example, FIG. 4 shows the pulses of the control signal V_pulse_I obtained for two different oscillation amplitudes: in FIG. 4a the pulses derive from an oscillation amplitude of the oscillator signal $V_{OUT}$ equal to ⅓ of that that produces the pulses of FIG. 4b.

Figure 5:
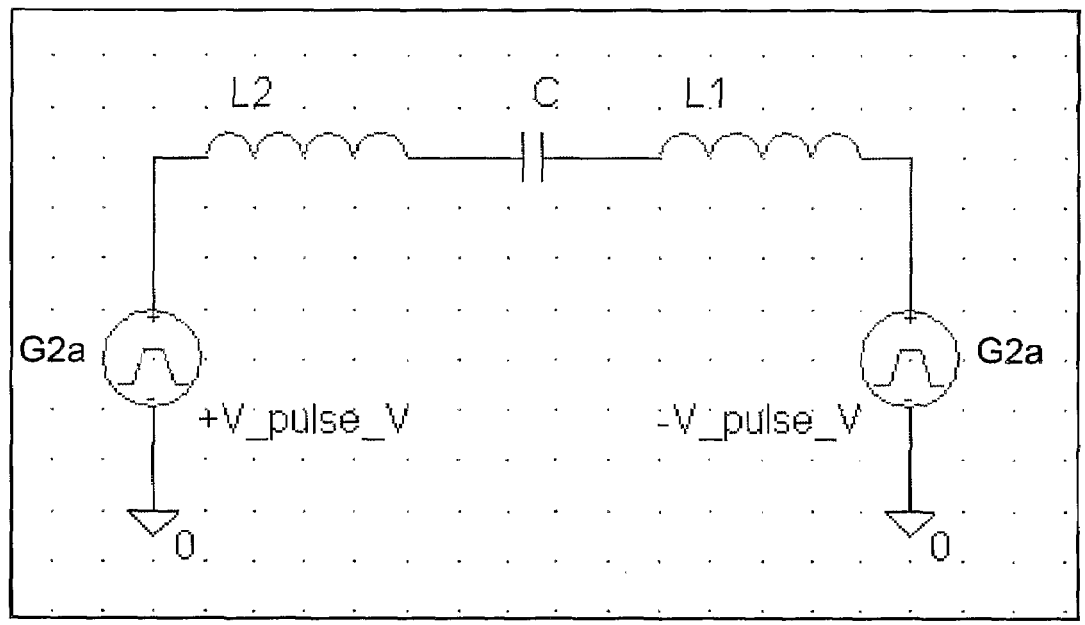
FIG. 5 shows a schematisation of the oscillator of a second embodiment of the device according to the invention.

FIG. 5 schematises a second configuration of the differential oscillator, that represents the dual form of that of FIG. 1. In fact, the oscillator of FIG. 5 comprises a series resonant LC circuit, wherein a capacitor C is series-connected between two, preferably equal, inductors L1 and L2, for keeping a differential structure, the oscillating signal $V_{OUT}=V_{C+}-V_{C-}$ generated by the device being drawn across the same capacitor C. In the configuration of FIG. 5, a voltage pulse applied across the resonant circuit does not alter the voltage value on the capacitor C, but instead it modifies the current along the inductors L1 and L2. In particular, a generator of a pair of pulsed voltages (indicated in the Figure by the references G2a and G2b, and that receives the oscillating signal across the capacitor C as input) closes the loop of the series resonant circuit, applying across it a pair of push-pull voltage pulses, respectively +V_pulse_V and −V_pulse_V, and it is hence crossed by the oscillating circuit current during the whole period. It is therefore necessary to make a generator of voltage pulses having low inner resistance, since such resistance in series decreases the merit factor of the resonator.

The configuration of FIG. 5 is advantageous since the variations of voltage on the reactive elements of the resonant circuit do not reflect on the voltages across the generator of voltage pulses. In this way, problems of high overvoltages are avoided, which otherwise could damage the integrated electronic components, need particularly felt with the last low voltage CMOS technologies. Consequently, being not limited by the voltages at the external terminals, the oscillation voltage on the reactive elements may be even much higher than the power supply one. The latter condition is extremely favourable in respect to the phase noise, that is proportional to the ratio between the noise amplitude and the oscillation amplitude.

Figure 6:
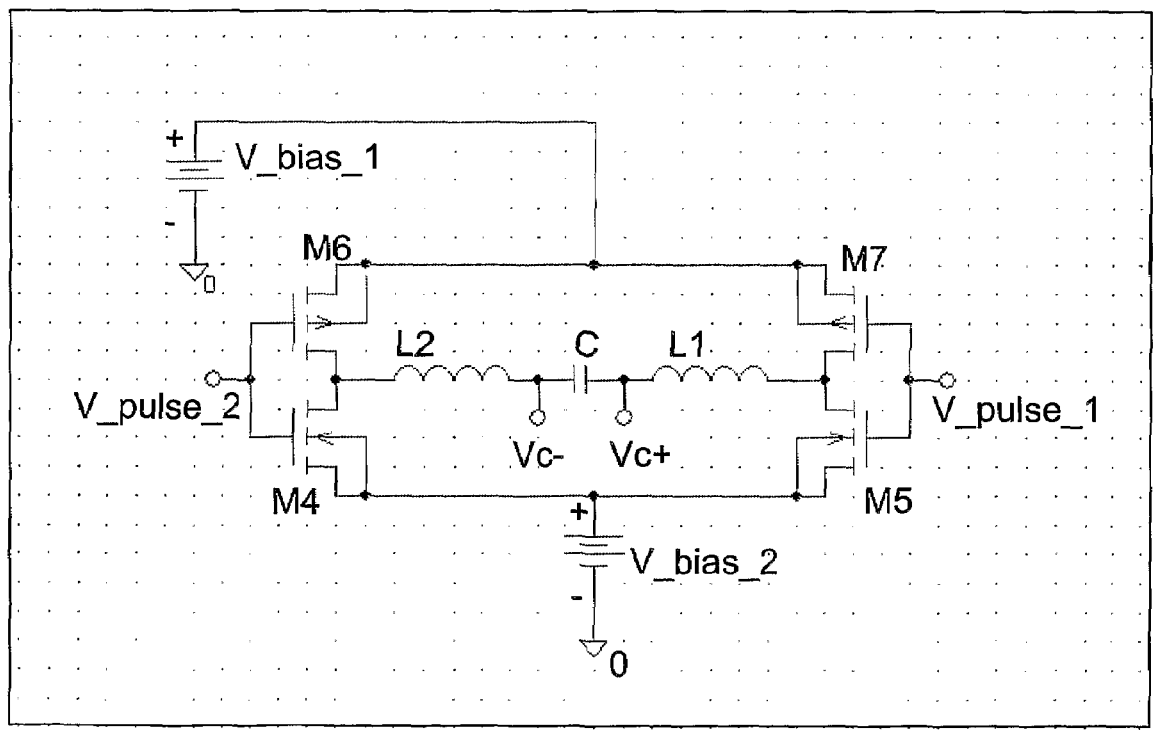
FIG. 6 schematically shows a possible circuit architecture of the oscillator of FIG. 5.

With reference to FIG. 6, a possible double power supply implementation of the configuration of FIG. 5 may be observed, that is part of a second embodiment of the device according to the invention. In particular, the oscillator of FIG. 6 is made with MOS transistors: each one of the two ends of the series resonant circuit is connected to the drain terminals of a respective pair of n-type and p-type MOS transistors (respectively, the pair M4 and M6, and the pair M5 and M7), also having gate terminal in common. The source terminals of the two p-type MOS transistors M6 and M7 are connected (as well as the respective substrates) to a first power supply voltage V_bias_1 (that is preferably positive), while the source terminals of the two n-type MOS transistors M4 and M5 are connected (as well as the respective substrates) to a second power supply voltage V_bias_2 (that is preferably negative, still mote preferably equal to the circuit ground, i.e. to zero, for simplifying the structure). Two pulsed voltage signals, respectively V_pulse_1 and V_pulse_2, are applied, in a symmetrical way, to the gate terminals of the two pairs, alternatively connecting, through a proper switching of the MOS transistors operating as switches, an end of the series resonant circuit to the first power supply voltage V_bias_1 and the other end to the second power supply voltage V_bias_2.

In conditions of absence of the voltage pulses V_pulse_1 and V_pulse_2, the switches implemented by the n-type MOS transistors, M4 and M5, are open, while the switches implemented by the p-type transistors MOS, M6 and M7, conduct, placing the two ends of the resonant circuit in contact with the first power supply voltage V_bias_1 and hence in short-circuit.

During the time interval in which the pulse is supplied, in an alternate way, to the two ends of the resonant circuit, the p transistor of the driven MOS pair is off, while the corresponding n transistor is led in conduction. In particular when V_pulse_1 is high, transistor M7 gets off and transistor M5 gets on, while when V_pulse_2 is high transistor M6 gets off and transistor M4 gets on. Consequently, in correspondence to the pulses, the differences between the two power supply voltages is applied across the resonant circuit. In particular, by applying V_pulse_1, a voltage equal to (V_bias_1−V_bias_2) is applied with positive polarity on the left end of L2, while by applying V_pulse_2, the voltage (V_bias_1−V_bias_2) is applied with positive polarity on the right end of L1. In other words, the energy is supplied to the oscillator as voltage pulse.

In order that the noise possibly present in the pulse generator does not transform in phase noise, the voltage pulses V_pulse_1 and V_pulse_2 must be applied when the current in the inductor is maximum (in the ideal case of resonant circuit without losses). This correspond to a null derivative of the current in the inductor, i.e. to a null value of the electromotive force at its ends. As in the case of the device of FIG. 1, even in this case, in presence of non-ideality, the application instant of the voltage pulse must be properly delayed, by choosing the instant at which the projection of the state variable "current of the inductors" on the first Floquet eigenvector of the state variables of the circuit as a whole cui is minimum, preferably null, according to the deviation from squareness of the two main eigenvectors. In particular, the differential structure of FIGS. 5 and 6, with the inductance subdivided into two components L1 and L2, allows the voltage across the capacitor C to be drawn in a differential way for making the signal of generation of the voltage pulses. Across the capacitor, a voltage pulse creates no disturbance since an instant front does not create a capacitor charge variation, and the presence of the inductor in series furthermore reduces any possible drop on the capacitor. The voltage across the capacitor C thus represents the best point of drawing the oscillator signal $V_{OUT}$ (drawable in a differential way: $V_{C+}$, $V_{C-}$). Such voltage is devoid of both spurious phase shifts and (deterministic) distortions due to the pulses.

The control circuit of the device of FIG. 6 generates the control pulses V_pulse_1 and V_pulse_2 starting directly from the oscillating signal $V_{OUT}$ generated by the oscillator across the capacitor C, such that they are in coherent relation with the phase of the same signal $V_{OUT}$. In particular, differently from the control pulses V_pulse_I of FIGS. 1-4, the pulses V_pulse_1 and V_pulse_2 are signals at the same pulsation frequency $\omega_0$ of the oscillating signal $V_{OUT}$ generated by the oscillator, phase shifted by 180° in respect to each other, which must be applied in correspondence to the passage through zero of the voltage $V_{OUT}$ on the capacitor C, i.e. in correspondence, respectively, to the maximum (for V_pulse_1) and to the minimum (for V_pulse_2) of the current in the inductors L1 and L2.

Figure 7:
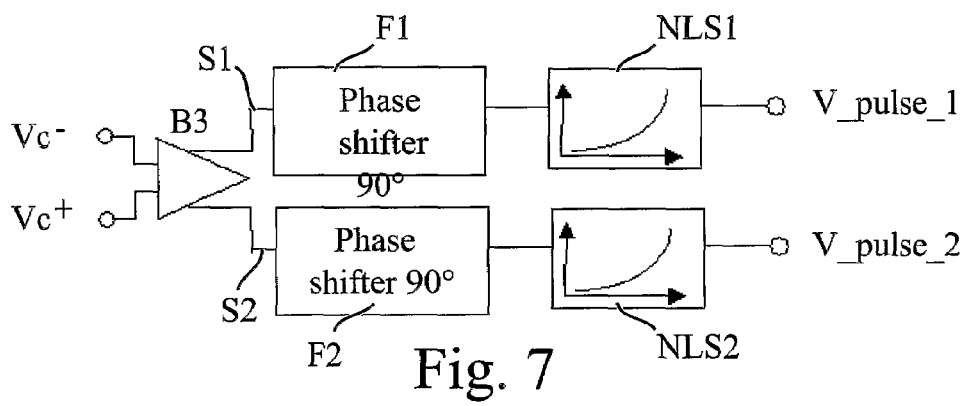
FIG. 7 schematically shows a possible circuit architecture of the control circuit that drives the oscillator of FIG. 6.

With reference to FIG. 7 it may be observed a possible implementation of the control circuit of the device of FIG. 6, wherein the signal $V_{OUT}$ is applied in a differential way ($V_{C+}$, $V_{C-}$) to a differential buffer B3, at the outputs of which a first and a second signal S1 and S2 are present, which, referred to the circuit ground, are respectively in phase and in push-pull with the signal $V_{OUT}$. Then, both signals S1 and S2 are applied to a respective filter F1 and F2 which shift their phases, in the ideal case, by 90°; in presence of non-ideality, the application instant of the voltage pulse must be properly delayed, and, consequently, the introduced phase shift may in general differ from 90°. Finally, the two phase shifted signals, at pulsation frequency $\omega_0$, are shaped as pulses through a respective stage NLS1 and NLS2 operating in non-linear state, e.g. operating in class C, thus generating the two pulsed voltage signals V_pulse_1 and V_pulse_2.

Figure 8:
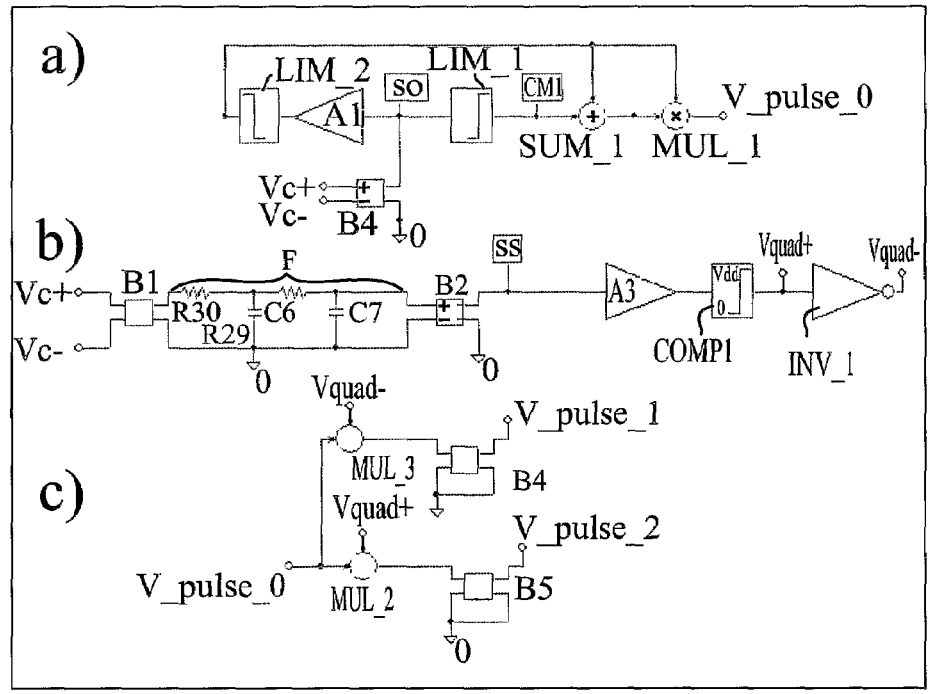
FIG. 8 schematically shows a further possible circuit architecture of the control circuit that drives the oscillator of FIG. 6.

With reference to FIG. 8 it may observed a further possible implementation of the control circuit of the device of FIG. 6, wherein the oscillating signal $V_{OUT}$, drawn across the capacitor C, is applied in a differential way ($V_{C+}$, $V_{C-}$) to a buffer B4 (in a first circuit portion shown in FIG. 8a), that transforms it in a single ended oscillating amplitude signal SO. Such signal SO is then applied to a circuit identical to that shown in FIG. 2b for generating a pulsed voltage signal V_pulse_0 at pulsation frequency $2\omega_0$ twice in respect to the signal SO (i.e. to the oscillating signal $V_{OUT}$) and with pulse length control (depending on the amplitude of the signal $V_{OUT}$). The sole difference in respect to the pulsed signal V_pulse_I generated by the circuit of FIG. 2b is the phase relation with the signal across the capacitor C.

Moreover, the oscillating signal $V_{OUT}$ is further applied in a differential way ($V_{C+}$, $V_{C-}$) to a buffer B1 (in a second control circuit portion shown in FIG. 8b), that transforms it in a single ended signal, the phase of which is then shifted by a filter F and finally applied to a buffer B2; in the case of ideal oscillator, without appreciable distortions, the phase shift introduced by the filter F is of 90°.

The phase shifted signal SS, preferably amplified by an amplifier A3, is transformed in a positive square wave signal Vquad+ through a comparator COMP1. The signal Vquad+ is then reversed by an inverter INV_1, at the output of which the positive square wave signal Vquad− complementary to the signal Vquad+ is present.

A third control circuit portion, shown in FIG. 8c, finally generates the two positive pulsed signals, alternate in respect to each other, to apply at the two control inputs of the switches of the oscillator of FIG. 6. In particular, the pulsed signal V_pulse_0 at pulsation frequency $2\omega_0$ is sent through two transmission gates, ideally represented as multipliers MUL_2 and MUL_3, respectively controlled by the signals Vquad+ and Vquad−, obtaining pulsed signals at pulsation frequency $\omega_0$, phase shifted in respect to each other. The transmission gates are preferably connected to respective amplifying stages B4 and B5, at the outputs of which the pulsed control signals V_pulse_1 and V_pulse_2 to apply to the switches of FIG. 6 are present.

Figure 9:
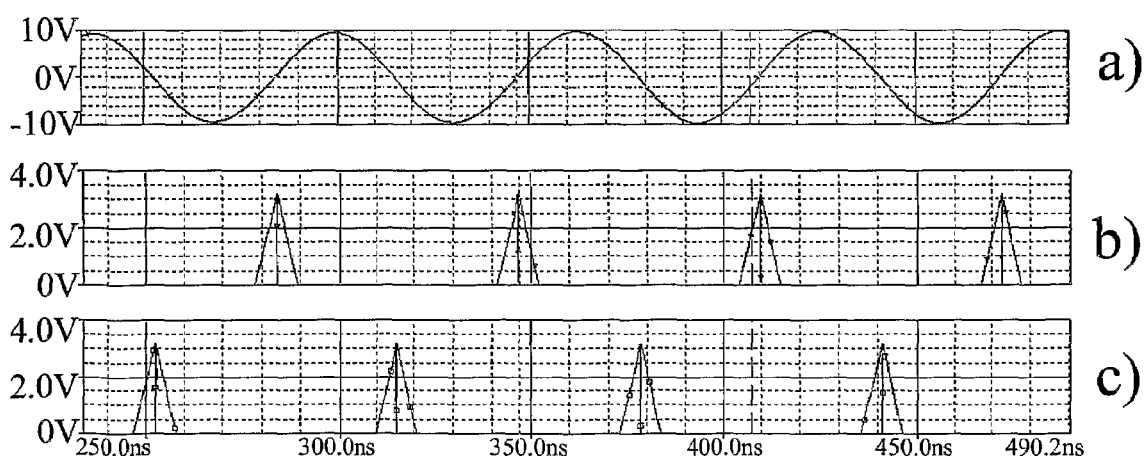
FIG. 9 shows some time graphs of the input and output signals of the circuit of FIG. 8.

FIG. 9 shows the time graphs of the oscillating signal $V_{OUT}$ (FIG. 9a), of the signal V_pulse_1 (FIG. 9b), and of the signal V_pulse_2 (FIG. 9c), in the ideal case.

Also for the control circuit of FIG. 8, it should be noted that while the amplitude of the pulses of the signals V_pulse_1 and V_pulse_2 is constant, equal to the saturation level $V_L$ of the limiters LIM_1 and LIM_2 of the circuit portion of FIG. 8a, their length depends on the transition time and hence on the amplitude of the oscillator sine voltage $V_{OUT}$ (either $V_{C+}$ and $V_{C-}$): as such amplitude increases the pulse reduces its length, reducing the amount of energy (i.e. the magnetic field linked to the inductors L1 and L2) added to the resonant circuit during power up of the switches of FIG. 6.

Figure 10:
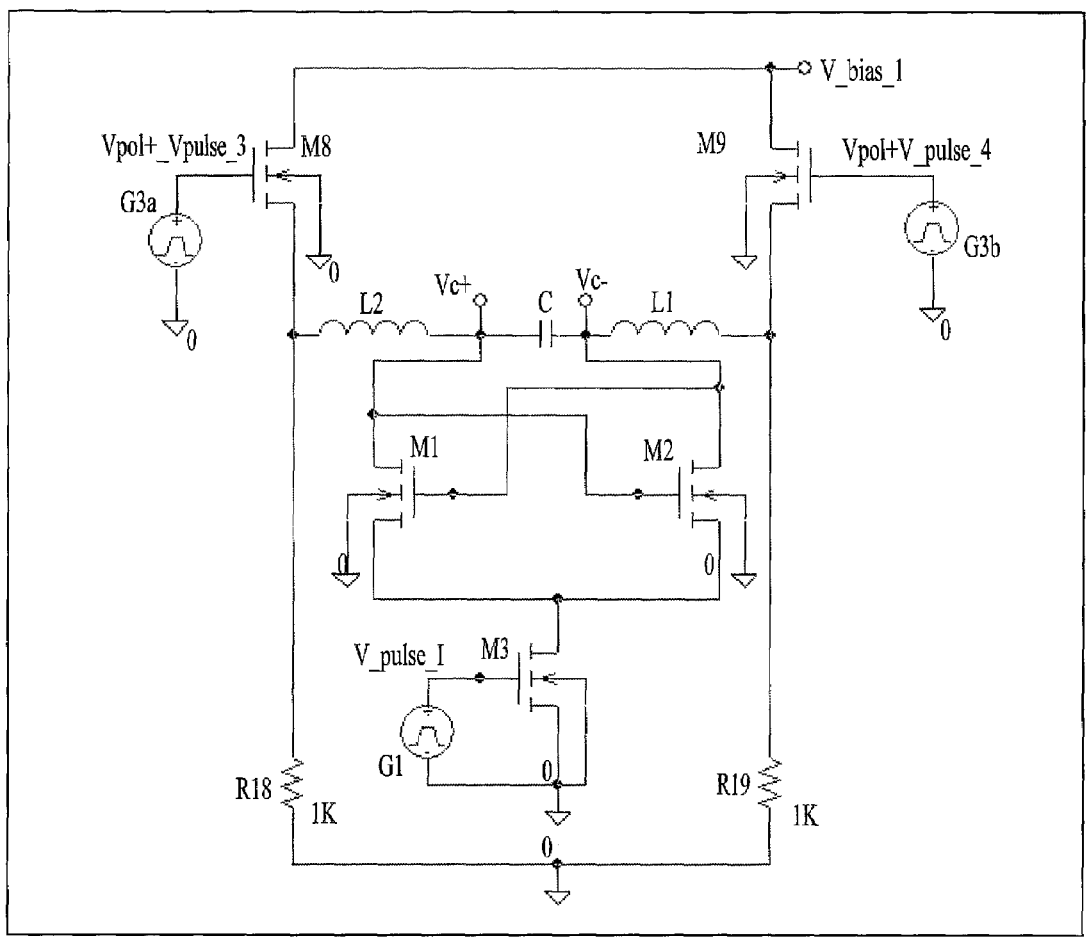
FIG. 10 schematically shows the oscillator of a third embodiment of the device according to the invention.

With reference to FIG. 10, it may be observed a third configuration of the differential oscillator of the device according to the invention, that provides the possibility of supplying the resonant circuit by simultaneously applying both current pulses and voltage pulses. In particular, the oscillator of FIG. 10 is still made with MOS transistors and, preferably, single power supply. A resonant LC circuit comprises two inductors L1 and L2 (preferably of equal inductance) connected in series across a capacitor C, across which the generated oscillating signal $V_{OUT}=V_{C+}-V_{C-}$ is drawn.

A differential circuit identical to that shown in FIG. 1 is connected across the capacitor, which circuit comprises two n-type MOS transistors M1 and M2, operating as switches, and a current generator made by means of a n-type transistor MOS M3 properly driven by a control pulse V_pulse_I.

The other ends of the inductors L1 and L2 are connected to the source terminals of two respective n-type MOS transistors M8 and M9, in source follower configuration, the drain terminals of which are connected to a power supply voltage V_bias_1. The transistor substrates, in an integrated circuit, are preferably connected to the circuit ground. Two resistors R18 and R19, connected between the drain terminal of the transistors M8 and M9, respectively, and the circuit ground, ensure the bias of transistors M8 and M9. Two respective voltage signals are applied, by a generator of a pair of voltage signals (indicated in Figure with the reference G3a and G3b), to the gate terminals of transistors M8 and M9, the dc voltage values Vpol of which voltage signals provide and represent the bias of transistors M8 and M9; two pulsed voltage signals, respectively V_pulse_3 and V_pulse_4, are further superimposed in an anti-symmetrical way to such dc values.

Figure 11:
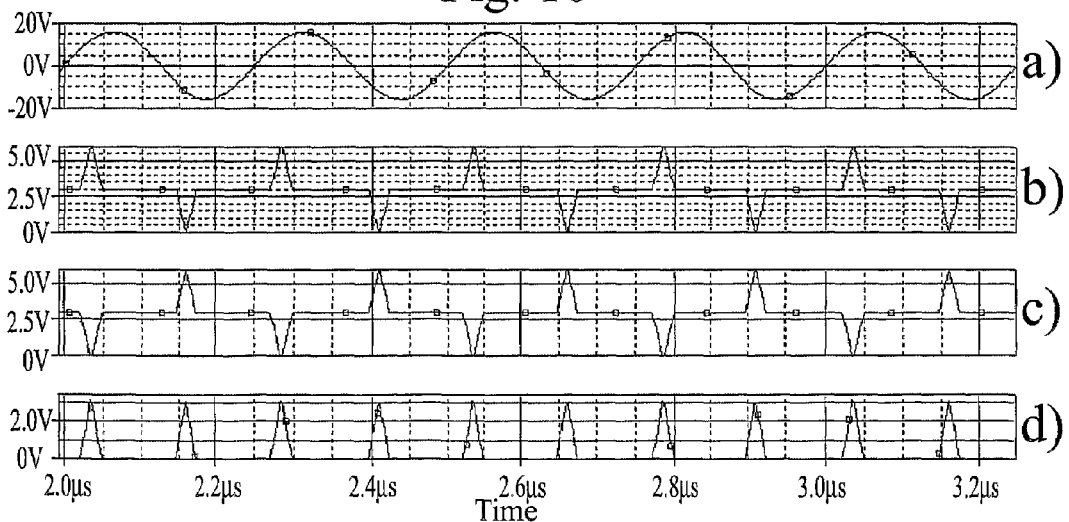
FIG. 11 shows some time graphs of the input and output signals of the circuit of FIG. 10.

The control circuit of the device of FIG. 10 generates the pulses V_pulse_I, V_pulse_3, and V_pulse_4 starting from the oscillating signal $V_{OUT}$ generated by the oscillator across the capacitor C, such that they are in coherent relation with the phase of the same signal $V_{OUT}$. In particular, the time graphs of the driving signals of the circuit of FIG. 10 are shown by way of example in FIG. 11, where: FIG. 11a shows the oscillating signal $V_{OUT}$; FIG. 11b shows the signal (Vpol+V_pulse_3) applied to the gate of transistor M8; FIG. 11c shows the signal (Vpol+V_pulse_4) applied to the gate of transistor M9; and FIG. 11d shows the signal V_pulse_I.

With respect to the differential circuit of transistors M1 and M2, the resonant circuit appears as a parallel resonant circuit, since the two transistors M8 and M9 present a low output resistance and they may be assimilated to short-circuits. Instead, with respect to transistors M8 and M9, the resonant circuit appears as a series resonant circuit, since transistors M1 and M2, with the current generator M3, present a high output resistance, when viewed from the drain, and they may thus be assimilated to open circuits.

Therefore, similarly to FIG. 1, the current pulse is generated by the current generator M3 properly driven by the control pulse V_pulse_I: transistors M1 and M2 operate as alternatively on switches, depending on the oscillator voltage value, sending in one sense or in the opposite one the current of power supply of the resonant circuit, viewed as a parallel. The two transistors M8 and M9, driven in push-pull by the pulses V_pulse_3 and V_pulse_4, respectively, provide a voltage variation across the resonant circuit, viewed as a series, equal to the difference (V_bias_3–V_bias_4) between the two voltages applied to the gate terminals of transistors M8 and M9.

In particular, the control circuit of the oscillator of FIG. 10, that generates the three pulsed control signals V_pulse_I, V_pulse_3, and V_pulse_4, may be made by employing circuits generating voltage pulses similar to those already illustrated above. For instance, it may be based on the circuit of FIG. 2 with the simple addition of two multipliers according to a proper square wave at frequency $\omega_0$, with preferably symmetrical levels, +1 and −1, necessary to alternate the generated pulses in the signal V_pulse_I. The two multipliers operate in push-pull for respectively producing the signals V_pulse_3, and V_pulse_4. In this regard, the phase shifts introduced in respect to the oscillating signal $V_{OUT}$ are properly adjusted for choosing the application instant of the pulses for re-generating the resonator energy.

In fact, the possibility to supply the resonant circuit by applying both current pulses and voltage pulses allows to freely choose the application instant if the pulses of re-generation of the resonator energy, otherwise imposed by the condition of null projection of the voltage or current variations on the first eigenvector. This possibility appears of particular interest, when the generated signal must cross a threshold, in order to properly space the pulse of re-generation apart from the instant of crossing of the same threshold. In fact, the pulse introduces amplitude noise, that decays according to the Floquet eigenvalues of the system, should such noise remain significant at the threshold crossing, would cause a jitter equivalently to the phase noise. The possibility to make the instant of application of the re-generation pulse arbitrary allows to properly space, within the oscillation period, the re-generation apart from the threshold crossing. The passage through a threshold is significant in systems with feedback control carried out through digital gates, e.g. in PLLs wherein a phase frequency detector or PFD, or a frequency divider, is present.

It is evident that for making the control circuit, that drives through pulses the switches supplying the current and/or voltage pulses of re-generation of the resonant circuit energy, it is necessary to have an electronic technology faster than the one that, in principle, would be necessary for making the simple oscillator. In fact, the transitions necessary to the pulse creation must be much shorter than the oscillation period. The evolution of the integrated circuit technology has led to the development of faster and faster MOS components, but with electronic characteristics more and more farther from ideality. In particular, the "short channel" MOS transistors, made for obtaining the highest switching frequencies, have noise characteristics much degraded in respect to the "long channel" ones. In this context, when optimisation of the oscillator noise characteristics is important, it is reasonable to assume the use of very fast circuit portions, which allow a selective intervention within the period, and thus which exchange speed for quality (from the phase noise point of view) of the circuit.

The advantages of the device according to the invention are considerable. By way of example, it is to be underlined, first of all, that the resonant circuit is separated from the device power supply, except at the instants in which it is less sensitive to the noise of this. Moreover, the device entails a reduced power consumption, by supplying energy only when and to the extent it is necessary, allowing the resonant circuit to quickly reach the oscillation steady state conditions.

The present invention has been described, by way of illustration and not by way of limitation, according to its preferred embodiment, but it should be understood that those skilled in the art can make variations and/or changes, without so departing from the related scope of protection, as defined by the enclosed claims.

The invention claimed is:

1. A differential oscillator device, comprising resonant electronic means, capable to provide on at least two terminals at least one oscillating signal $V_{OUT}$, which comprises a generator electronic means capable to supply at least one pulsed power supply to said resonant electronic means in coherent phase relation with said at least one oscillating signal $V_{OUT}$, said at least one pulsed power supply comprising a plurality of pulses which are generated by the generator electronic means at selected instants of the period of said at least one oscillating signal $V_{OUT}$, at which instants the effect of noise of said at least one pulsed power supply on a phase noise of said at least one oscillating signal $V_{OUT}$ is lower than a maximum threshold value.

2. A device according to claim 1, wherein said selected instants are instants at which a projection of a vector representative of said at least one pulsed power supply on a first Floquet eigenvector of state variables of the circuit as a whole is lower than a maximum threshold value.

3. A device according to claim 1, wherein said selected instants are instants at which a projection of a vector representative of said at least one pulsed power supply on a first Floquet eigenvector of state variables of the differential oscillator circuit as a whole is lower than a maximum threshold value.

4. A device according to claim 2, wherein said maximum threshold value is equal to zero.

5. A device according to claim 1, wherein said selected instants are instants at which the effects of orbital deviations due to projections of a vector representative of said at least one pulsed power supply on Floquet eigenvectors of state variables of the circuit as a whole are minimized to the aim of the phase noise.

6. A device according to claim 1, wherein said selected instants are instants at which the effects on the phase noise of orbital deviations due to projections of a vector representative of said at least one pulsed power supply on Floquet eigenvectors of state variables of the circuit as a whole are lower than a maximum threshold value.

7. A device according to claim 1, wherein said generator electronic means is capable to carry out a gain control for adjusting the energy supplied to said resonant electronic means.

8. A device according to claim 7, wherein one or more pulses of said at least one pulsed power supply has a duration depending on the amplitude of said at least one oscillating signal $V_{OUT}$.

9. A device according to claim 1, wherein said at least one pulsed power supply comprises one or more current pulses.

10. A device according to claim 1, wherein said at least one pulsed power supply comprises one or more voltage pulses.

11. A device according to claim 1, wherein said resonant electronic means comprises a capacitor, and two inductors, each one connected to a respective end of the capacitor, said at least one oscillating signal $V_{OUT}$, being supplied across the capacitor.

12. A device according to claim 1, wherein said generator electronic means comprises switching means capable to be controlled by driving means, that receives said at least one oscillating signal $V_{OUT}$ and supplies at least one control pulsed signal (V_pulse_I, V_pulse_1, V_pulse_2, V_pulse_3, V_pulse_4) that controls said switching means so as to supply said at least one pulsed power supply to said resonant electronic mean.

13. A device according to claim 12, wherein said switching means are made by means of MOS transistors and/or bipolar transistors.

14. A device according to claim 13, wherein said at least one pulsed power supply comprises one or more current pulses, wherein said resonant electronic means comprises a capacitor, and two inductors, each one connected to a respective end of the capacitor, said at least one oscillating signal $V_{OUT}$, being supplied across the capacitor, and wherein said switching means comprises two n-type MOS transistors, in differential configuration, each one of the source terminals of which is connected to a respective end of the capacitor, and to the source terminals of which the drain terminal of a third n-type MOS transistor operating as current generator is connected, said driving means driving the gate terminal of the third transistor by means of a voltage pulsed signal (V_pulse_I).

15. A device according to claim 14, wherein said selected instants are instants at which a projection of a vector representative of said at least one pulsed power supply on a first Floquet eigenvector of state variables of the circuit as a whole is lower than a maximum threshold value, and wherein said voltage pulsed signal (V_pulse_I) comprises one or more pulses in correspondence of instants at which the projection of a vector representative of the state variable "voltage of the capacitor" on the first Floquet eigenvector of the state variables of the circuit as a whole is lower than said maximum threshold value.

16. A device according to claim 14, wherein said driving means comprises phase shifter means, that receives as input said at least one oscillating signal $V_{OUT}$, the output of which is connected to signal handling electronic means capable to generate said voltage pulsed signal (V_pulse_I) having a pulsation frequency twice in respect to that of said at least one oscillating signal $V_{OUT}$.

17. A device according to claim 13, wherein said at least one pulsed power supply comprises one or more voltage pulses, wherein said resonant electronic means comprises a capacitor, and two inductors, each one connected to a respective end of the capacitor, said at least one oscillating signal $V_{OUT}$, being supplied across the capacitor, and wherein said switching means comprises two p-type MOS transistors, the source terminals of which are connected to a first power supply voltage V_bias_1, and the drain terminals of which are each connected to a respective inductor and, through respective connection electronic means, to a second power supply voltage V_bias_2, said driving means driving, in an alternate way, the gate terminals of such two MOS transistors by means of two respective further voltage pulsed signals (V_pulse_1, V_pulse_2).

18. A device according to claim 17, wherein said second power supply voltage V_bias_2 is equal to the circuit ground.

19. A device according to claim 17, wherein said connection electronic means comprises a two n-type MOS transistors, each one of which has the drain and gate terminals in common with the corresponding terminals of a respective p-type transistor MOS, and the source terminal connected to said second power supply voltage V_bias_2.

20. A device according to claim 13, wherein said at least one pulsed power supply comprises one or more voltage pulses, wherein said resonant electronic means comprises a capacitor, and two inductors, each one connected to a respective end of the capacitor, said at least one oscillating signal $V_{OUT}$, being supplied across the capacitor, and wherein said voltage pulsed signals (V_pulse_3, V_pulse_4) are supplied to the series resonant circuit through driving means and electronic means of connection of two common source mounted MOS transistors, comprising at least one resistor for each one of the two.

21. A device according to claim 13, wherein said at least one pulsed power supply comprises one or more voltage pulses, wherein said resonant electronic means comprises a capacitor, and two inductors, each one connected to a respective end of the capacitor, said at least one oscillating signal $V_{OUT}$, being supplied across the capacitor, and wherein said switching means comprises two n-type MOS transistors, the drain terminals of which are connected to a first power supply voltage V_bias_1, and the source terminals of which are each connected to a respective inductor and, through respective connection electronic means, preferably resistive means, to a second power supply voltage V_bias_2, preferably equal to the circuit ground, said driving means driving, in anti-symmetrical way, the gate terminals of such two MOS transistors by means of two respective further voltage pulsed signals (V_pulse_3, V_pulse_4).

22. A device according to claim 17, wherein said selected instants are instants at which a projection of a vector representative of said at least one pulsed power supply on a first Floquet eigenvector of state variables of the circuit as a whole is lower than a maximum threshold value, and wherein each one of said two further voltage pulsed signals (V_pulse_1, V_pulse_2; V_pulse_3, V_pulse_4) comprises one or more pulses in correspondence of instants at which the projection of a vector representative of the state variable "current in the inductor" on the first Floquet eigenvector of the state variables of the circuit as a whole is lower than said maximum threshold value.

23. A device according to claim 16, wherein said driving means comprises:
- second signal handling electronic means, that receives as input said at least one oscillating signal $V_{OUT}$, capable to generate an auxiliary voltage pulsed signal (V_pulse_0) having a pulsation frequency twice in respect to that of said at least one oscillating signal $V_{OUT}$,
- phase shifter means, that receives as input said at least one oscillating signal $V_{OUT}$, capable to generate a phase shifted signal (SS), and
- third signal handling electronic means, that receives as input said phase shifted signal, capable to generate said two further voltage pulsed signals (V_pulse_1, V_pulse_2) phase shifted in respect to each other, having the same pulsation frequency of said at least one oscillating signal $V_{OUT}$.

24. A device according to claim 23, wherein said driving means comprises:
- differential separator means, that receives as input said at least one oscillating signal $V_{OUT}$, capable to generate a first and a second further auxiliary signals respectively in phase and in push-pull with said at least one oscillating signal $V_{OUT}$,
- phase shifter means, that receives as input said first and second further auxiliary signals and that shifts their phases, and
- fourth signal handling electronic means, that receives as input said further phase shifted auxiliary signals, capable to generate said two further voltage pulsed signals (V_pulse_1, V_pulse_2) having the same pulsation frequency of said at least one oscillating signal $V_{OUT}$.

25. A device according to claim 24, wherein said fourth signal handling electronic means comprises one or more stages operating in a non linear steady state.

26. A device according to claim 25, wherein said one or more stages operated in Class C.

27. A device according to claim 20, wherein said driving means comprises signal handling electronic means, that receives as input a voltage pulsed signal (V_pulse_I) having a pulsation frequency twice in respect to that of said at least one oscillating signal $V_{OUT}$, capable to generate said two further voltage pulsed signals (V_pulse_3, V_pulse_4) having the same pulsation frequency of said at least one oscillating signal $V_{OUT}$.

28. A device according to claim 27, wherein said signal handling electronic means comprises multiplying means that multiplies said voltage pulsed signal (V_pulse_I) received as input by a square wave at the same pulsation frequency of said at least one oscillating signal $V_{OUT}$, with symmetrical levels, necessary to alternate the polarities of the pulses of said voltage pulsed signal (V_pulse_I) received as input.

29. A device according to claim 12, wherein said selected instants are instants at which a projection of a vector representative of said at least one pulsed power supply on a first Floquet eigenvector of state variables of the circuit as a whole is lower than a maximum threshold value, wherein said at least one pulsed power supply comprises one or more current pulses, wherein said at least one pulsed power supply comprises one or more voltage pulses, wherein said resonant electronic means comprises a capacitor, and two inductors, each one connected to a respective end of the capacitor, said at least one oscillating signal $V_{OUT}$, being supplied across the capacitor, and wherein said switching means simultaneously supplies to said resonant electronic means current power supply pulses and voltage power supply pulses, said power supply pulses being applied in correspondence of instants at which the projection of a state vector formed by the variables "voltage of the capacitor" and "current in the inductor" on the first Floquet eigenvector of the state variables of the circuit as a whole is lower than said maximum threshold value.

30. A process of supplying pulsed power to a differential oscillator device, the process comprising:
- providing the differential oscillator device with resonant electronic means, capable to provide on at least two terminals at least one oscillating signal $V_{OUT}$, which comprises a generator electronic means capable to supply at least one pulsed power supply to said resonant electronic means in coherent phase relation with said at least one oscillating signal $V_{OUT}$, said at least one pulsed power supply comprising a plurality of pulses which are generated by the generator electronic means at selected instants of the period of said at least one oscillating signal $V_{OUT}$, at which instants the effect of noise of said at least one pulsed power supply on a phase noise of said at least one oscillating signal $V_{OUT}$ is lower than a maximum threshold values; and
- supplying at least one pulsed power supply to said resonant electronic means in coherent phase relation with said at least one oscillating signal $V_{OUT}$, said at least one pulsed power supply comprising a plurality of pulses at selected instants of the period of said at least one oscillating signal $V_{OUT}$, at which instants the effect of noise of said at least one pulsed power supply on a phase noise of said at least one oscillating signal $V_{OUT}$ is lower than a maximum threshold value.

31. A differential oscillator device according to claim 3, wherein said generator electronic means is capable to supply said at least one pulsed power supply to said resonant electronic means at instants at which the weighted sum of the projections of a vector representative of said at least one pulsed power supply on all the Floquet eigenvectors of the state variables of the differential oscillator circuit as a whole is lower than a maximum threshold value.

32. A differential oscillator device according to claim 28, wherein said symmetrical levels are equal to +1 and −1.

* * * * *